(12) United States Patent
Grossi et al.

(10) Patent No.: US 8,664,702 B2
(45) Date of Patent: Mar. 4, 2014

(54) SHALLOW TRENCH ISOLATION FOR A MEMORY

(75) Inventors: Alessandro Grossi, Milan (IT); Marcello Mariani, Milan (IT); Paolo Cappelletti, Seveso (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/315,337

(22) Filed: Dec. 9, 2011

(65) Prior Publication Data

US 2012/0080738 A1    Apr. 5, 2012

Related U.S. Application Data

(62) Division of application No. 12/341,002, filed on Dec. 22, 2008, now Pat. No. 8,097,506.

(51) Int. Cl.
*H01L 29/76*    (2006.01)
(52) U.S. Cl.
USPC .......................................... 257/288; 257/314

(58) Field of Classification Search
None
See application file for complete search history.

(56) References Cited

U.S. PATENT DOCUMENTS

| | | | |
|---|---|---|---|
| 6,512,282 B2 | 1/2003 | Esaki | |
| 6,579,761 B1 * | 6/2003 | Hsieh | 438/257 |
| 6,969,653 B2 * | 11/2005 | Jwa | 438/260 |
| 7,091,091 B2 * | 8/2006 | Ding | 438/265 |
| 7,432,157 B2 | 10/2008 | Kim | |
| 2003/0224572 A1 * | 12/2003 | Yang | 438/257 |
| 2008/0061350 A1 | 3/2008 | Watanabe | |
| 2008/0217685 A1 * | 9/2008 | Kim | 257/344 |

* cited by examiner

*Primary Examiner* — Scott B Geyer
(74) *Attorney, Agent, or Firm* — Dorsey & Whitney LLP

(57) ABSTRACT

In some embodiments, a gate structure with a spacer on its side may be used as a mask to form self-aligned trenches in a microelectronic memory, such as a flash memory. A first portion of the gate structure may be used to form the mask, together with sidewall spacers, in some embodiments. Then, after forming the shallow trench isolations, a second portion of the gate structure may be added to form a mushroom shaped gate structure.

14 Claims, 2 Drawing Sheets

SHALLOW TRENCH ISOLATION FOR A MEMORY

This application is a divisional of U.S. patent application Ser. No. 12/341,002 filed on Dec. 22, 2008 now U.S. Pat. No. 8,097,506.

BACKGROUND

This relates generally to microelectronic memories.

Columns of flash memory cells in memory arrays may be isolated by shallow trench isolations. In the shallow trench isolation process, shallow trenches are formed between the columns using, as a mask, the polysilicon that will form the gate electrode. Ultimately, these trenches are filled with an insulator that isolates one column from its two adjacent neighbors.

DETAILED DESCRIPTION

In accordance with some embodiments, substrate active area corners, adjacent to shallow trench isolations, are made electrically inactive. By making these corners electrically inactive, reliability issues related to the corners may be reduced. For example, active area thinning or thickening, increased electric field in the corner region, or combinations of these may lead to accelerated degradation of the active oxide over these corners.

In accordance with one embodiment, a self-aligned, shallow trench isolation approach may be utilized. However, other approaches may be utilized as well. In the self-aligned shallow trench isolation approach, part of the floating gate is defined while etching the trench for shallow trench isolation. Then the rest of the floating gate polysilicon is deposited and patterned further on in the process flow using lithographic or damascene techniques.

Another approach that may be utilized, in accordance with some embodiments, is advanced self-aligned shallow trench isolation where the whole floating gate is defined while etching the trench during shallow trench isolation. Also, a poly-chemical mechanical planarization (poly-CMP) approach may be used. In poly-CMP, the floating gate is built by a damascene process. Then the shallow trench isolation nitride acts as a place holder and the field oxide is used as a stopping layer for the damascene process.

In accordance with some embodiments, spacers are used around gate material that will ultimately form at least part of a gate electrode. The spacers on the gate material form an etching mask to space the resulting, etched shallow trench away from the ultimate gate electrode structure. This spacing forms electrically inactive active area corners at the substrate locations covered by the spacers. Those spacers create an electrically inactive ledge region of the substrate active area to either side of the gate electrode. The ledges and the shallow trench isolation are self-aligned to the gate material.

Figure 1:
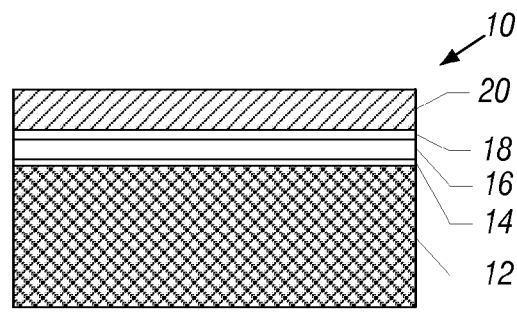
FIG. 1 is an enlarged, cross-sectional view at an early stage of manufacture.

Referring to FIG. 1, a bulk silicon microelectronic substrate 12 may be covered by a tunnel dielectric 14, a lower gate layer 16, a dielectric layer 18, and a nitride layer 20 to form the structure 10. The tunnel dielectric 14 and the dielectric layer 18 may be formed by any suitable insulating material including oxide. The lower gate layer 16 may be doped or undoped polysilicon or other suitable conductive or non-conductive gate forming materials. In another embodiment, the substrate 12 may be formed of epitaxial material.

Figure 2:
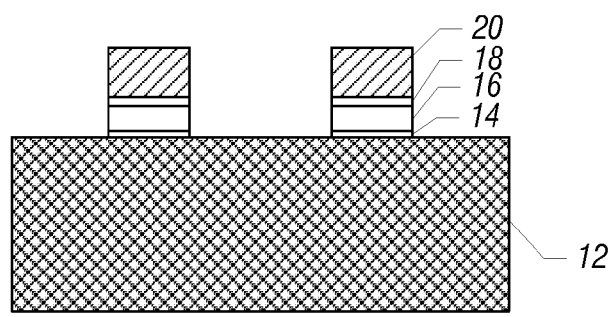
FIG. 2 is an enlarged, cross-sectional view at a stage subsequent to that shown in FIG. 1 in accordance with one embodiment.

As shown in FIG. 2, gate structures are then defined and etched to form strips. The individual gates are not separated at this point. In FIG. 2, two adjacent columns are shown, but many parallel columns may be provided. Each strip may include a nitride layer 20 over a dielectric layer 18, a lower gate layer 16, and a tunnel dielectric 14, situated on the microelectronic substrate 12.

In some embodiments, the layer 16 is the lower part of a two-part floating gate for a flash memory. However, the present invention is not limited to floating gates or two-part gates.

Figure 3:
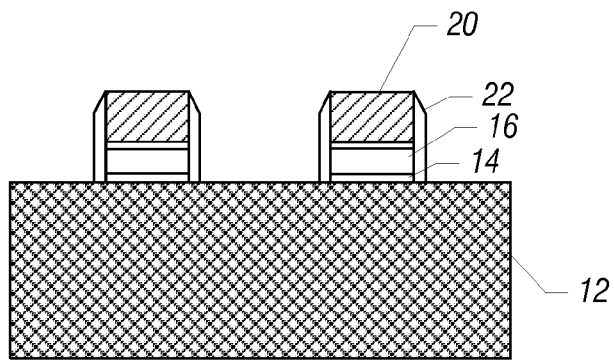
FIG. 3 is an enlarged, cross-sectional view at a stage subsequent to that shown in FIG. 2 in accordance with one embodiment.

Referring to FIG. 3, spacers 22 have been formed on the lower gate structures of FIG. 2. The spacers 22 may be sidewall spacers in one embodiment. However, overhanging spacers, such as an overhanging nitride spacer, may be used in another embodiment. The spacer 22 material may be an insulator, such as oxide, for example. In some embodiments, it is advantageous to use, as the spacer 22, a dielectric other than nitride and material other than the lower gate material to facilitate subsequent nitride mask removal.

Spacers 22 may be formed by blanket depositing the spacer material. In one embodiment, this blanket deposited spacer structure is then anisotropically etched to form the spacers 22 shown in FIG. 3.

In some embodiments, unlike conventional sidewall spacers used for spacing source drain implants, the spacers 22 are arranged on the sides of the gate structure that will not have a source or drain. That is, the spacers are aligned perpendicular to the direction through the subsequently formed source/drains.

Figure 4:
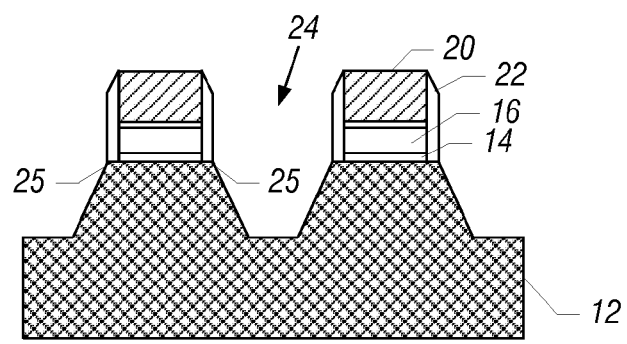
FIG. 4 is an enlarged, cross-sectional view at a stage subsequent to that shown in FIG. 3 in accordance with one embodiment.

Then, as shown in FIG. 4, the structure shown in FIG. 3 is used as a mask for shallow trench 24 isolation etching. The resulting shallow trenches 24 separate the strips and, ultimately, separate adjacent columns of cells from one another. The shallow trenches 24 are displaced outwardly of the gate stack by way of the spacers 22, forming the electrically inactive ledges 25 in the active area 34.

Figure 5:
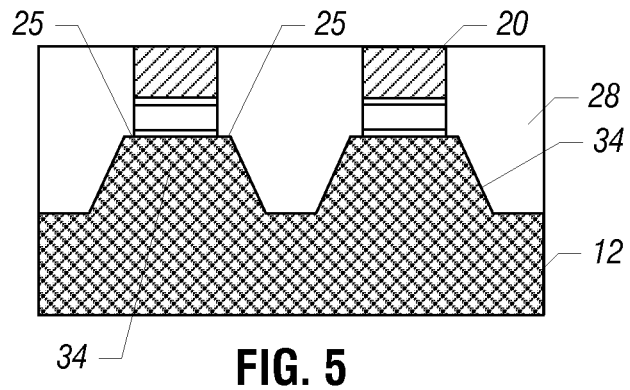
FIG. 5 is an enlarged, cross-sectional view at a stage subsequent to that in accordance with one embodiment.

Next, a sidewall oxidation may be performed, followed by gap filling and field oxide chemical mechanical planarization to form the field oxide 28, as shown in FIG. 5. In some embodiments, the spacer 22 (no longer shown) is left in place, buried within the field oxide 28. In other embodiments, the spacer 22 is removed prior to gap filling and, in some cases, before sidewall oxidation. The sidewall oxidation oxidizes edges of the trench 24 sidewalls to recover etch damage, to protect the trench 24, and to round the corners of the active areas 34.

Figure 6:
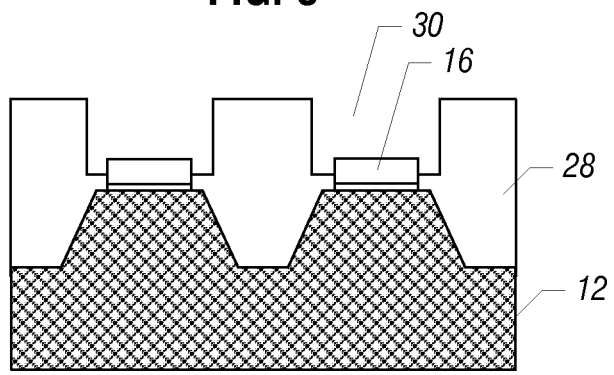
FIG. 6 is an enlarged, cross-sectional view at a subsequent stage.

An etch process, illustrated in FIG. 6, may remove the nitride layer 20, whose function is completed. A buffer oxide wet etch may be utilized. As a result, the layer 16 may be partially exposed, because the width of the resulting trench 30 may be wider than the width of the layer 16 in some embodiments. The trench 30 width may correspond to the width of the active area 34 defined between adjacent trenches 24.

Figure 7:
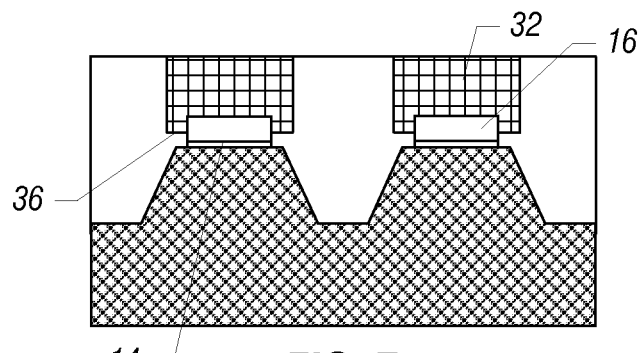
FIG. 7 is an enlarged, cross-sectional view at a subsequent stage.

Next, as shown in FIG. 7, an upper gate layer 32 may be deposited on the layer 16 and patterned to form a strip extending parallel to the shallow trenches 24. Note that the upper gate layer 32 extends over the sides of the lower gate layer 16, forming an overhanging or mushroom shaped gate structure, that may be a floating gate in some embodiments.

The dielectric 36 under the layer 32 is thicker than the tunnel dielectric 14 under the layer 16 in one embodiment. In some embodiments, the layer 16 may be undoped as deposited and the layer 32 may be doped as deposited. Subsequent thermal treatments may dope the layer 16 via diffusion from the layer 32.

Figure 8:
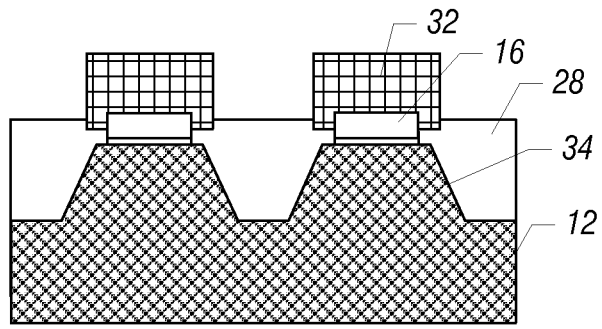
FIG. 8 is an enlarged, cross-sectional view at a subsequent stage.

Finally, the field oxide 28 may be subjected to recession down to a level slightly below the upper level of the lower gate layer 16, as shown in FIG. 8. This exposes the upper surface of the upper gate layer 32, but not its lower surface, avoiding etch-related damage to the tunnel dielectric.

The rest of the process can proceed conventionally, including formation of interpoly dielectric, control gates, and sources and drains in the column direction (into the page) in the active areas 34.

In some embodiments, it is advantageous to form the shallow trenches 24 prior to forming a mushroom shaped floating gate. The techniques described herein are applicable to both NOR and NAND flash memories, as well as other microelectronic memories.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a substrate including at least two parallel trenches in said substrate defining an active area between said trenches; and
   a gate structure in said active area, said active area including electrically inactive strips between edges of said gate structure and respective ones of said trenches, and wherein said gate structure is a two-part gate structure including a gate oxide over said active area, a first part formed in contact with said gate oxide, and a second part over said first part and in contact with said first part, the gate oxide and the first part having the same width at an interface between the gate oxide and the first part.

2. The apparatus of claim 1 wherein said apparatus is a flash memory.

3. The apparatus of claim 1 including sidewall spacers on the sides of said gate structure over said strips.

4. The apparatus of claim 3 including a mushroom shaped gate structure.

5. The apparatus of claim 1 wherein said first part is a lower gate layer and the second part is an upper gate layer.

6. The apparatus of claim 5 wherein said upper gate layer is wider than the lower gate layer.

7. An apparatus comprising:
   a substrate including at least two parallel trenches in said substrate defining an active area between said trenches;
   a mushroom shaped gate structure in said active area, said active area including strips between edges of said gate structure and respective ones of said trenches, wherein said mushroom shaped gate structure is a floating gate comprising an oxide layer over said active area and a gate layer in contact with said oxide layer and having a width equal to a width of the oxide layer at an interface of the two layers.

8. The apparatus of claim 7 wherein said floating gate structure is a two-part gate structure, wherein the oxide layer is a gate oxide and the gate layer is a first part of the two-part gate structure, the two-part gate structure further comprising a second part overhanging said first part and in contact therewith.

9. An apparatus comprising:
   a substrate including at least two parallel trenches in said substrate defining an active area between said trenches;
   a gate structure in said active area, said active area including electrically inactive strips between each of said parallel trenches and said gate structure leaving an unetched portion of said substrate between each of said parallel trenches and edges of said structure, and wherein said gate structure is a two-part gate structure including at least an oxide layer and a lower gate layer having a same width at an interface between said oxide layer and said lower gate layer.

10. The apparatus of claim 9 wherein said apparatus is a flash memory.

11. The apparatus of claim 9 including sidewall spacers on the sides of said gate structure over said strips.

12. The apparatus of claim 11 including a mushroom shaped gate structure.

13. An apparatus comprising:
    a substrate including at least two parallel trenches in said substrate defining an active area between said trenches;
    a mushroom shaped gate structure in said active area, said active area including strips on the edges of said gate structure and in between each shallow trench isolation and said gate structure leaving an unetched portion of said substrate between said shallow trench isolation trenches and edges of said structure, wherein said mushroom shaped gate structure is a floating gate, and wherein said floating gate includes at least an oxide layer and a gate layer having a same width at an interface between the oxide layer and the gate layer.

14. The apparatus of claim 13 wherein said floating gate structure is a two-part gate structure and wherein the oxide layer is a gate oxide and the gate layer is a lower gate layer, and the two-part gate structure includes an upper gate layer overhanging said lower gate layer and in contact therewith.

* * * * *